United States Patent
Pietambaram et al.

(10) Patent No.: US 12,148,704 B2
(45) Date of Patent: Nov. 19, 2024

(54) ELECTRICAL INTERCONNECT BRIDGE

(71) Applicant: Intel Corporation, Santa Clara, CA (US)

(72) Inventors: Srinivas V. Pietambaram, Gilbert, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/224,504

(22) Filed: Jul. 20, 2023

(65) Prior Publication Data

US 2023/0361043 A1 Nov. 9, 2023

Related U.S. Application Data

(60) Division of application No. 16/931,690, filed on Jul. 17, 2020, now Pat. No. 11,791,269, which is a
(Continued)

(51) Int. Cl.
*H05K 1/02* (2006.01)
*H01L 21/02* (2006.01)
(Continued)

(52) U.S. Cl.
CPC ...... *H01L 23/5381* (2013.01); *H01L 21/4857* (2013.01); *H01L 21/486* (2013.01);
(Continued)

(58) Field of Classification Search
CPC ... H05K 1/02; H05K 1/11; H05K 1/18; H05K 3/10; H01L 21/02; H01L 21/44;
(Continued)

(56) References Cited

U.S. PATENT DOCUMENTS

| | | |
|---|---|---|
| 4,812,490 A | 3/1989 | Kleeberg |
| 4,888,450 A | 12/1989 | Lando |

(Continued)

FOREIGN PATENT DOCUMENTS

EP 1780790 5/2007

OTHER PUBLICATIONS

International Search Report and Written Opinion for PCT Application No. PCT/US2017-020986 filed Mar. 2017, mailed May 19, 2017, 15 pgs.

(Continued)

*Primary Examiner* — Xiaoliang Chen
(74) *Attorney, Agent, or Firm* — Schwabe, Williamson & Wyatt P.C.

(57) ABSTRACT

Electrical interconnect bridge technology is disclosed. An electrical interconnect bridge can include a bridge substrate formed of a mold compound material. The electrical interconnect bridge can also include a plurality of routing layers within the bridge substrate, each routing layer having a plurality of fine line and space (FLS) traces. In addition, the electrical interconnect bridge can include a via extending through the substrate and electrically coupling at least one of the FLS traces in one of the routing layers to at least one of the FLS traces in another of the routing layers.

8 Claims, 7 Drawing Sheets

Related U.S. Application Data continuation of application No. 15/089,509, filed on Apr. 2, 2016, now abandoned.

(51) Int. Cl.

| | | |
|---|---|---|
| *H01L 21/44* | (2006.01) | |
| *H01L 21/48* | (2006.01) | |
| *H01L 21/52* | (2006.01) | |
| *H01L 21/56* | (2006.01) | |
| *H01L 21/60* | (2006.01) | |
| *H01L 21/84* | (2006.01) | |
| *H01L 23/00* | (2006.01) | |
| *H01L 23/02* | (2006.01) | |
| *H01L 23/12* | (2006.01) | |
| *H01L 23/15* | (2006.01) | |
| *H01L 23/29* | (2006.01) | |
| *H01L 23/31* | (2006.01) | |
| *H01L 23/48* | (2006.01) | |
| *H01L 23/498* | (2006.01) | |
| *H01L 23/538* | (2006.01) | |
| *H01L 23/552* | (2006.01) | |
| *H01L 25/065* | (2023.01) | |
| *H05K 1/11* | (2006.01) | |
| *H05K 1/18* | (2006.01) | |
| *H05K 3/10* | (2006.01) | |

(52) U.S. Cl.
CPC .. *H01L 23/49838* (2013.01); *H01L 23/49894* (2013.01); *H01L 23/5384* (2013.01); *H01L 23/5385* (2013.01); *H01L 23/5386* (2013.01); *H01L 24/17* (2013.01); *H01L 25/0655* (2013.01); *H01L 23/5383* (2013.01); *H01L 24/13* (2013.01); *H01L 2224/131* (2013.01); *H01L 2224/16113* (2013.01); *H01L 2224/16227* (2013.01); *H01L 2224/32225* (2013.01); *H01L 2224/48227* (2013.01); *H01L 2224/73204* (2013.01); *H01L 2224/73265* (2013.01); *H01L 2224/92125* (2013.01); *H01L 2924/05432* (2013.01); *H01L 2924/05442* (2013.01); *H01L 2924/1433* (2013.01); *H01L 2924/1434* (2013.01); *H01L 2924/1511* (2013.01); *H01L 2924/15192* (2013.01); *H01L 2924/15747* (2013.01); *H01L 2924/1579* (2013.01); *H01L 2924/181* (2013.01)

(58) Field of Classification Search
CPC ......... H01L 21/48; H01L 21/52; H01L 21/56; H01L 21/60; H01L 21/84; H01L 21/486; H01L 21/4857; H01L 21/6835; H01L 23/00; H01L 23/02; H01L 23/12; H01L 23/15; H01L 23/29; H01L 23/31; H01L 23/48; H01L 23/84; H01L 23/5381; H01L 23/5383; H01L 23/5384; H01L 23/5385; H01L 23/49816; H01L 23/49822; H01L 23/49827; H01L 23/49836; H01L 23/49838; H01L 24/13; H01L 24/17; H01L 25/0655; H01L 2224/131; H01L 2224/05442; H01L 2224/1433; H01L 2224/1434; H01L 2224/16113; H01L 2224/16227; H01L 2224/23204; H01L 2224/48227; H01L 2224/73265; H01L 2224/92125; H01L 2924/181; H01L 2924/1511; H01L 2924/15192; H01L 2924/15947; H01L 2924/1579
USPC ......... 174/253; 205/70, 117, 118, 122, 134, 205/135, 156, 223; 439/81; 29/874, 884; 333/117, 239; 257/774; 438/624

See application file for complete search history.

(56) References Cited

U.S. PATENT DOCUMENTS

| | | | |
|---|---|---|---|
| 5,483,421 A | 1/1996 | Gedney | |
| 5,855,821 A | 1/1999 | Chau | |
| 5,929,522 A | 7/1999 | Weber | |
| 6,037,547 A | 3/2000 | Blish, II | |
| 6,184,577 B1 | 2/2001 | Takemura | |
| 6,348,427 B1 | 2/2002 | Hamada | |
| 6,403,201 B1 | 6/2002 | Otagiri | |
| 6,423,570 B1 | 7/2002 | Ma | |
| 6,444,921 B1 | 9/2002 | Wang | |
| 6,528,145 B1 | 3/2003 | Berger | |
| 6,646,350 B2 | 11/2003 | Tanaka | |
| 6,829,574 B1 | 12/2004 | Ito | |
| 7,999,042 B2 | 8/2011 | Matayabas, Jr. | |
| 9,214,437 B1 | 12/2015 | Hsu | |
| 9,349,681 B1 | 5/2016 | Kelly | |
| 9,368,450 B1 | 6/2016 | Gu | |
| 9,401,306 B2 | 7/2016 | Mahajan | |
| 9,418,965 B1 | 8/2016 | Li | |
| 9,449,912 B1 | 9/2016 | Zhang | |
| 9,567,687 B2 * | 2/2017 | Zhang | ............... C25D 5/50 |
| 9,786,824 B2 * | 10/2017 | Illek | ............... H01L 33/54 |
| 2001/0023983 A1 | 9/2001 | Kobayashi | |
| 2001/0048157 A1 | 12/2001 | Murtuza | |
| 2002/0020909 A1 | 2/2002 | Wakashima | |
| 2002/0020916 A1 | 2/2002 | Ito | |
| 2002/0185717 A1 | 12/2002 | Eghan | |
| 2003/0179282 A1 | 9/2003 | Fisher | |
| 2003/0186536 A1 | 10/2003 | Brenner | |
| 2003/0234179 A1 * | 12/2003 | Bang | ............... B81C 99/0085 |
| | | | 205/70 |
| 2004/0004001 A1 * | 1/2004 | Cohen | ............... H01P 11/005 |
| | | | 205/118 |
| 2004/0004002 A1 * | 1/2004 | Thompson | ............... B33Y 10/00 |
| | | | 205/118 |
| 2004/0007468 A1 * | 1/2004 | Cohen | ............... G01P 15/0802 |
| | | | 205/223 |
| 2004/0007470 A1 * | 1/2004 | Smalley | ............... G01P 15/125 |
| | | | 205/223 |
| 2004/0020782 A1 * | 2/2004 | Cohen | ............... G01P 15/0802 |
| | | | 205/118 |
| 2004/0046255 A1 | 3/2004 | Hsu | |
| 2004/0140862 A1 * | 7/2004 | Brown | ............... H01P 3/06 |
| | | | 333/156 |
| 2005/0023145 A1 * | 2/2005 | Cohen | ............... C25D 5/022 |
| | | | 205/135 |
| 2005/0045484 A1 * | 3/2005 | Smalley | ............... H01L 21/7682 |
| | | | 205/135 |
| 2005/0093170 A1 | 5/2005 | Kalidas | |
| 2005/0104177 A1 | 5/2005 | Lin | |
| 2005/0142739 A1 * | 6/2005 | Kumar | ............... G01R 3/00 |
| | | | 438/254 |
| 2005/0221644 A1 * | 10/2005 | Kim | ............... G01R 1/07357 |
| | | | 439/81 |
| 2005/0253606 A1 * | 11/2005 | Kim | ............... H01R 13/187 |
| | | | 324/755.01 |
| 2006/0012034 A1 | 1/2006 | Kadoya | |
| 2006/0049483 A1 | 3/2006 | Lin | |
| 2006/0051948 A1 * | 3/2006 | Kim | ............... G01R 1/0483 |
| | | | 438/597 |
| 2006/0053625 A1 * | 3/2006 | Kim | ............... C25D 1/003 |
| | | | 29/874 |
| 2006/0076687 A1 | 4/2006 | Lin | |
| 2006/0108678 A1 * | 5/2006 | Kumar | ............... H01L 24/95 |
| | | | 257/690 |
| 2006/0286829 A1 * | 12/2006 | Kim | ............... G01R 3/00 |
| | | | 439/81 |
| 2007/0077747 A1 | 4/2007 | Heck | |
| 2007/0096065 A1 | 5/2007 | Kodas | |
| 2007/0096291 A1 | 5/2007 | Kawabata | |
| 2007/0096292 A1 | 5/2007 | Machida | |
| 2007/0098883 A1 | 5/2007 | Itoh | |
| 2007/0104960 A1 | 5/2007 | Asano | |
| 2007/0116962 A1 | 5/2007 | Asano | |

(56) References Cited

U.S. PATENT DOCUMENTS

| | | |
|---|---|---|
| 2007/0152314 A1 | 7/2007 | Manepalli |
| 2007/0187844 A1 | 8/2007 | Chen |
| 2007/0210427 A1 | 9/2007 | Lytle |
| 2007/0232727 A1 | 10/2007 | Lin |
| 2007/0278632 A1 | 12/2007 | Zhao |
| 2008/0006936 A1 | 1/2008 | Lin |
| 2008/0042297 A1 | 2/2008 | Lin |
| 2008/0316722 A1 | 12/2008 | Sumida |
| 2009/0140442 A1 | 6/2009 | Lin |
| 2009/0267212 A1 | 10/2009 | Wada |
| 2009/0316946 A1 | 12/2009 | Wang |
| 2009/0320281 A1 | 12/2009 | Arana |
| 2010/0081236 A1 | 4/2010 | Yang |
| 2010/0133683 A1 | 6/2010 | Fillion |
| 2010/0193972 A1 | 8/2010 | Yamamoto |
| 2010/0207265 A1 | 8/2010 | Muthukumar et al. |
| 2010/0237472 A1 | 9/2010 | Gillis |
| 2011/0006433 A1 | 1/2011 | Kanetaka |
| 2011/0074041 A1 | 3/2011 | Leung et al. |
| 2011/0121445 A1 | 5/2011 | Mori |
| 2011/0221071 A1 | 9/2011 | Motohashi |
| 2011/0228506 A1 | 9/2011 | Chen |
| 2011/0277813 A1 | 11/2011 | Rogers |
| 2012/0073973 A1 | 3/2012 | Yamashita |
| 2012/0111621 A1 | 5/2012 | Ohigashi |
| 2012/0222891 A1 | 9/2012 | Ishida |
| 2012/0228917 A1 | 9/2012 | Huang |
| 2012/0280381 A1 | 11/2012 | Beyne |
| 2013/0009325 A1 | 1/2013 | Mori |
| 2013/0120095 A1 | 5/2013 | Weatherspoon |
| 2013/0168854 A1 | 7/2013 | Karikalan et al. |
| 2013/0200528 A1* | 8/2013 | Lin ................. H01L 24/97 |
| | | 257/774 |
| 2013/0337268 A1 | 12/2013 | Jeon |
| 2014/0054796 A1 | 2/2014 | Gong |
| 2014/0084439 A1 | 3/2014 | Ihara |
| 2014/0085846 A1 | 3/2014 | Ma |
| 2014/0091474 A1 | 4/2014 | Startston |
| 2014/0174807 A1 | 6/2014 | Roy et al. |
| 2014/0179836 A1 | 6/2014 | Chun |
| 2014/0183732 A1 | 7/2014 | Huang |
| 2014/0264791 A1 | 9/2014 | Manusharow |
| 2014/0311781 A1 | 10/2014 | Kishino |
| 2014/0321091 A1 | 10/2014 | Zhang |
| 2014/0332966 A1 | 11/2014 | Xiu |
| 2014/0332975 A1 | 11/2014 | Raorane |
| 2014/0357020 A1 | 12/2014 | Aleksov |
| 2015/0001717 A1 | 1/2015 | Karhade |
| 2015/0001733 A1 | 1/2015 | Karhade |
| 2015/0008767 A1 | 1/2015 | Shinoda |
| 2015/0014855 A1 | 1/2015 | Yap |
| 2015/0028486 A1 | 1/2015 | Liu |
| 2015/0048503 A1 | 2/2015 | Chiu |
| 2015/0084206 A1 | 3/2015 | Lin |
| 2015/0084210 A1 | 3/2015 | Chiu et al. |
| 2015/0108002 A1* | 4/2015 | Kim ................. C25D 1/003 |
| | | 205/122 |
| 2015/0116965 A1 | 4/2015 | Kim et al. |
| 2015/0137362 A1 | 5/2015 | Lau |
| 2015/0155214 A1 | 6/2015 | Lim |
| 2015/0171067 A1 | 6/2015 | Raorane |
| 2015/0179570 A1 | 6/2015 | Marimuthu |
| 2015/0179616 A1 | 6/2015 | Lin |
| 2015/0179895 A1 | 6/2015 | Herner |
| 2015/0279817 A1 | 10/2015 | Zhang |
| 2015/0279823 A1 | 10/2015 | Haba |
| 2015/0305162 A1 | 10/2015 | Tang |
| 2015/0311575 A1* | 10/2015 | Brown ................. H01P 3/06 |
| | | 205/118 |
| 2015/0361211 A1 | 12/2015 | Chun |
| 2015/0364394 A1 | 12/2015 | Lin |
| 2015/0364410 A1 | 12/2015 | Hando |
| 2015/0369668 A1 | 12/2015 | Watabe |
| 2015/0371951 A1 | 12/2015 | Yeh |
| 2016/0005628 A1 | 1/2016 | Yap |
| 2016/0013138 A1 | 1/2016 | Chen |
| 2016/0085899 A1 | 3/2016 | Qian |
| 2016/0088736 A1 | 3/2016 | Sankman |
| 2016/0133571 A1 | 5/2016 | Lee |
| 2016/0172299 A1 | 6/2016 | Noveski |
| 2016/0197037 A1 | 7/2016 | Startston |
| 2016/0233153 A1 | 8/2016 | Kidwell, Jr. |
| 2016/0247761 A1 | 8/2016 | Song |
| 2016/0276174 A1 | 9/2016 | Kim |
| 2016/0293538 A1 | 10/2016 | Tamiya |
| 2016/0322344 A1 | 11/2016 | Raorane |
| 2017/0066789 A1 | 3/2017 | Tak |
| 2017/0125379 A1* | 5/2017 | Chen ................. H01L 23/3142 |
| 2019/0019691 A1* | 1/2019 | Pietambaram ........ H01L 21/486 |
| 2019/0057915 A1 | 2/2019 | Starkston |

OTHER PUBLICATIONS

International Preliminary Report on Patentability for PCT Application No. PCT/US2017-020986, mailed Oct. 11, 2018, 10 pgs.

Office Action from Taiwan Patent Application No. 106105431, mailed Nov. 10, 2020, 8 pages.

Notice of Allowance from Taiwan Patent Application No. 106105431, mailed Feb. 20, 2021, 3 pages.

Office Action for German Patent Application No. 112017001828.5 mailed May 27, 2022, 9 pgs., no translation.

* cited by examiner

ELECTRICAL INTERCONNECT BRIDGE

CROSS-REFERENCE TO RELATED APPLICATIONS

This application is a divisional of U.S. patent application Ser. No. 16/931,690, filed Jul. 17, 2020, which is a continuation of U.S. patent application Ser. No. 15/089,509, filed on Apr. 2, 2016, now Abandoned Sep. 16, 2020, the entire contents of which are hereby incorporated by reference herein.

TECHNICAL FIELD

Embodiments described herein relate generally to electronic device packages, and more particularly to interconnect bridges of package substrates.

BACKGROUND

High bandwidth interconnects on a package are becoming increasingly important for high performance computing. The embedded multi-die interconnect bridge (EMIB), pioneered and developed by Intel®, is a breakthrough that addresses this need and facilitates a lower cost and simpler 2.5D packaging approach for very high density interconnects between heterogeneous dies on a single package. Instead of an expensive silicon interposer with "through silicon vias" (TSV), a typical EMIB comprises a small silicon bridge chip that is embedded in the package substrate, enabling very high density die-to-die connections only where needed, such as with fine line and spaced (FLS) traces. Standard flip-chip assembly is used for robust power delivery and to connect high-speed signals directly from a chip to a package substrate. The EMIB eliminates the need for TSVs and specialized interposer silicon that add complexity and cost.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Although a typical EMIB offers significant advantages and cost benefits over other solutions available for die interconnects such as silicon interposer or high density substrate surface layers, a typical EMIB does have some drawbacks. For example, a typical EMIB bridge is constructed of silicon and manufactured with costly wafer fabrication processes. Also, the silicon material has a low coefficient of thermal expansion (CTE) compared to the build-up dielectric material of package substrates in which the silicon is embedded. As a result, a typical EMIB suffers from thermomechanical issues such as stresses, warpage, etc. due to the differential thermal expansion of the materials involved.

Accordingly, electrical interconnect bridges are disclosed which are formed of low-cost material that can be constructed utilizing low-cost techniques while providing FLS traces on multiple routing layers. In one aspect, thermomechanical issues can be mitigated to a certain extent by the electrical interconnect bridges of the present disclosure. In one example, an electrical interconnect bridge in accordance with the present disclosure can include a bridge substrate formed of a mold compound material. The electrical interconnect bridge can also include a plurality of routing layers within the bridge substrate, each routing layer having a plurality of FLS traces. In addition, the electrical interconnect bridge can include a via extending through the substrate and electrically coupling at least one of the FLS traces in one of the routing layers to at least one of the FLS traces in another of the routing layers.

Figure 1:
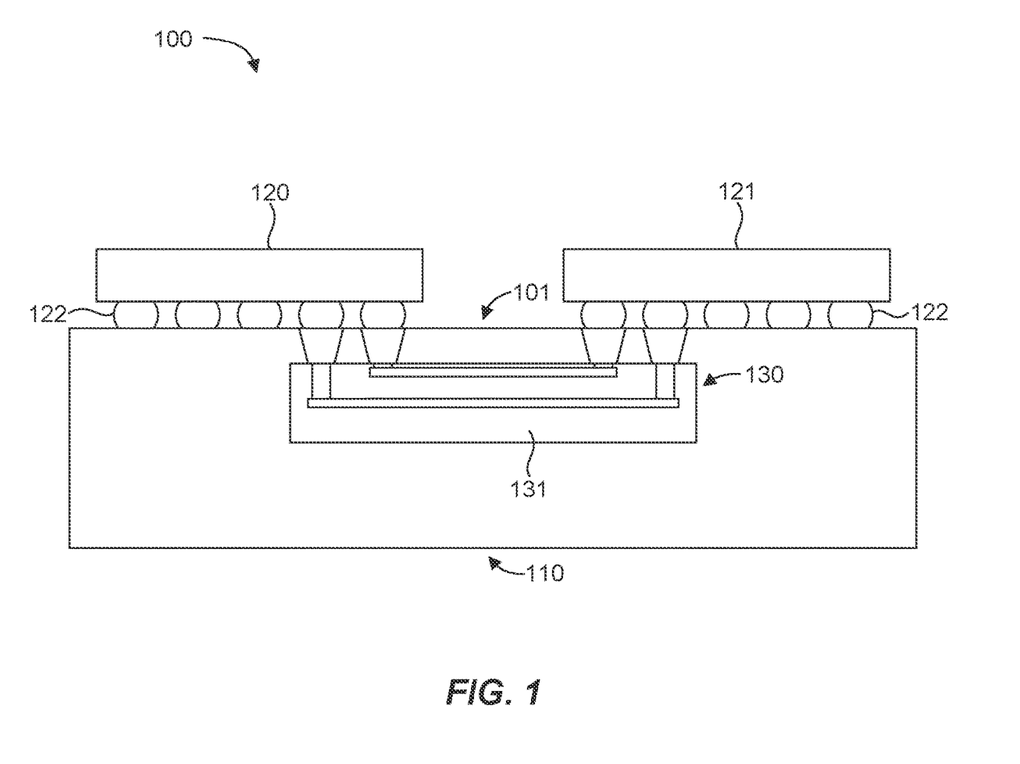
FIG. 1 illustrates a schematic cross-section of an electronic device package in accordance with an example.

Referring to FIG. 1, an exemplary electronic device package 100 is schematically illustrated in cross-section. The package 100 can include a package substrate 110 and a plurality of electronic components 120, 121 mounted on or otherwise coupled to the package substrate 110. The package 100 can also include an electrical interconnect bridge 130 embedded in the package substrate 110 to electrically couple the first electronic component 120 and the second electronic component 121, for example, to route electrical signals between the electronic components 120, 121. The bridge 130 may generally be identified as an example of an embedded multi-die interconnect bridge (EMIB) architecture or assembly. The bridge 130 embedded in the package substrate 110 can form an electronic device package substrate assembly 101.

The electronic components 120, 121 can be any electronic device or component that may be included in an electronic device package, such as a semiconductor device (e.g., a die, a chip, or a processor). In one embodiment, each of the electronic components 120, 121 may represent a discrete chip. The electronic components 120, 121 may be, include, or be a part of a processor, memory, or application specific integrated circuit (ASIC) in some embodiments. The electronic components 120, 121 can be attached to the package substrate 110 according to a variety of suitable configurations including, a flip-chip configuration, as depicted, or other configurations such as wire bonding and the like. In the flip-chip configuration, active sides of the electronic components 120, 121 are attached to a surface of the package substrate 110 using interconnect structures 122 such as bumps or pillars, as shown. The interconnect structures 122 may be configured to route electrical signals between the electronic components 120, 121 and the package substrate 110. In some embodiments, the interconnect structures 122 may be configured to route electrical signals such as, for example, I/O signals and/or power or ground signals associated with the operation of the electronic components 120, 121.

The package substrate 110 may include electrical routing features configured to route electrical signals to or from the electronic components 120, 121. The electrical routing features may be internal and/or external to the bridge 130. For example, in some embodiments, the package substrate 110 may include electrical routing features such as pads or traces configured to receive the interconnect structures 122 and route electrical signals to or from the electronic components 120, 121. Package level interconnects (not shown) such as, for example, solder balls, may be coupled to a surface of the package substrate 110 to further route the electrical signals to other electrical devices (e.g., motherboard or other chipset). In some embodiments, the package substrate 110 is an epoxy-based laminate substrate having a core and/or build-up layers. The package substrate 110 may include other suitable types of substrates in other embodiments.

The bridge 130 may be a dense interconnect structure that provides a route for electrical signals. The bridge 130 may include a bridge substrate 131 having electrical routing features formed thereon to provide a chip-to-chip connection between the electronic components 120, 121. The bridge 130 may be embedded in a cavity of the package substrate 110 in some embodiments. The bridge 130 may comport with embodiments described in connection with other figures herein. In some embodiments, a portion of the electronic components 120, 121 may overlie the embedded bridge 130, as illustrated.

The bridge 130 can include electrically conductive pads at least partially on or in a top surface of the bridge. The electrically conductive pads can include conductive metal, such as copper, gold, silver, aluminum, zinc, nickel, brass, bronze, iron, etc. A dielectric layer can be formed over the bridge 130 and the package substrate 110. Conductive vias and solder connections can pass through the dielectric layer. In one aspect, such a dielectric layer can allow for dimensional variations in the placement of the embedded bridge 130 and can electrically isolate interconnection areas. The dielectric layer can include oxide, or other materials, such as insulating materials.

The package substrate 110 may be formed of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in printed circuit boards (PCBs).

Although two electronic components 120, 121 electrically coupled by a single bridge 130 are depicted in FIG. 1, other embodiments may include any suitable number of electronic components and bridges connected together in other possible configurations including three-dimensional configurations. For example, another electronic component that is disposed on the package substrate 110 in or out of the page relative to the electronic components 120, 121 of FIG. 1 may be coupled to one or both of the electronic components 120, 121 using another bridge.

Figure 2:
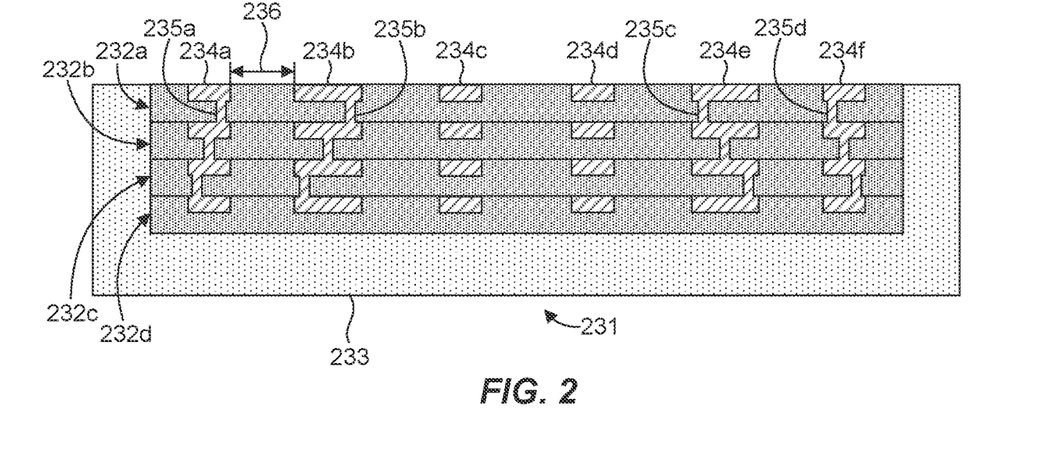
FIG. 2 illustrates a schematic cross-section of an electrical interconnect bridge in accordance with an example.

FIG. 2A illustrates an electrical interconnect bridge 230 in accordance with an example of the present disclosure. The bridge 230 can be incorporated with a package substrate as discussed above with respect to FIG. 1. The bridge 230 can include a bridge substrate 231 and multiple routing layers 232a-d. The bridge substrate 231 can comprise any suitable material and be made by any suitable process. As discussed in more detail below, the bridge substrate of one or more of the routing layers 232a-d can include a mold compound material. In the embodiment illustrated in FIG. 2A, the bridge substrate of multiple routing layers includes the same material (e.g., mold compound), which therefore have the same coefficient of thermal expansion (CTE). In one aspect, all routing layers of the bridge substrate can comprise the same material and CTE. The CTE of the material of the routing layers 232a-d can be from about 7 to about 50 ppm per degree Celsius. In some embodiments, the CTE of the material of the routing layers 232a-d can be from about 7 to about 25 ppm per degree Celsius. The material of the routing layers can therefore have a CTE that is higher than that of silicon (about 3 ppm per degree Celsius), which can mitigate thermomechanical issues to some extent. The bridge substrate 231 can also optionally include an encapsulant material 233 disposed at least partially about each of the routing layers 232a-d, such that the encapsulant material is proximate to a portion of a package substrate in which the bridge is embedded, as in FIG. 1. Any suitable encapsulant material can be utilized and disposed about the bridge substrate in any suitable manner, such as molding an over-mold material about the bridge substrate. The encapsulant material can have any suitable CTE.

Each routing layer 232a-d can include traces 234a-f to electrically couple electronic components. The bridge 230 is oriented 90 degrees relative to the orientation of the bridge shown in FIG. 1, such that traces extend into and out of the page in FIG. 2. One or more vias 235a-d can extend through the bridge substrate 231 and electrically couple one or more of the traces in one routing layer to one or more of the traces in another routing layer. Although FIG. 2 shows vias electrically coupling traces in four routing layers, it should be recognized that the bridge substrate 231 can include any suitable number of routing layers having any suitable number of traces, and that any suitable number of vias can be utilized to electrically connect traces in different routing layers. In addition, the vias can have any suitable shape or configuration, such as a circular and/or non-circular (e.g., rectangular) cross-section.

Figure 3:
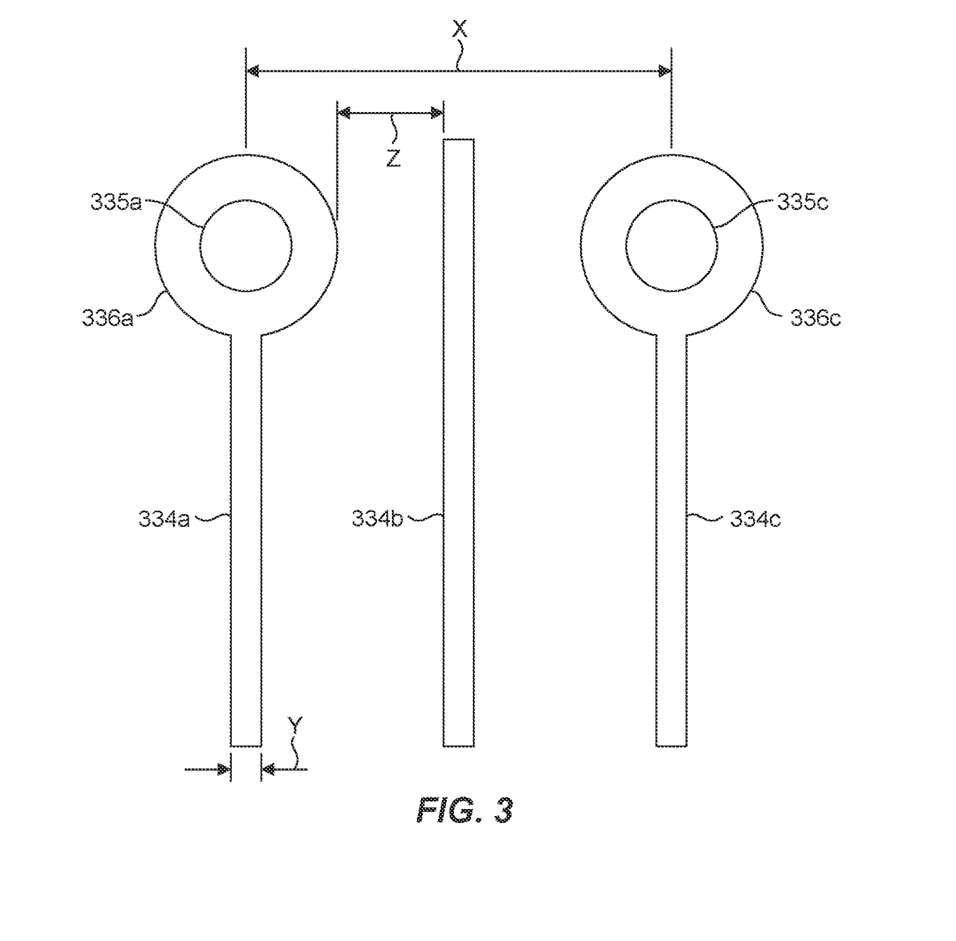
FIG. 3 illustrates trace, via, and via pad dimensions in accordance with an example.

FIG. 3 is a top-down example of pads, traces, and vias in accordance with various embodiments. Specifically, FIG. 3 depicts a top-down view of one routing layer of a bridge as disclosed herein. The bridge may include a plurality of traces such as traces 334a-c. In some embodiments, the traces 334a-c may be copper, while in other embodiments the traces may be some other electrically and/or thermally conductive material.

In some embodiments, some of the traces such as traces 334a and 334c can be coupled with a pad such as via pads 336a and 336c, respectively. The pads 336a, 336c can be constructed of a same or similar materials as the traces 334a-c. For example, the pads 336a, 336c may be constructed of copper. In other embodiments the pads 336a, 336c can be constructed of a different material than the traces 334a-c, for example, some other electrically and/or thermally conductive material.

As shown in FIG. 3, the pads 336a, 336c can have a larger footprint than the traces 334a-c, as will be discussed below. As discussed herein, "footprint" may generally refer to the lateral size of the element. Similarly, it can be seen that not all traces may be directly coupled with a pad. For example, the trace 334b may not be coupled with a pad. In some embodiments, the pads 336a, 336c can be coupled with one or more conductive vias such as vias 335a and 335c. As shown in FIG. 3, the vias 335a, 335c can have a smaller footprint than the pads 336a, 336c. That is, the vias 335a, 335c may have a smaller diameter than the pads 336a, 336c. The smaller diameter of the vias may be to provide a small margin of error during manufacturing such that if the via is not placed directly on the center of the pad, the via may not extend beyond the perimeter of the pad. It will be understood that although the traces 334a-c are depicted as generally linear, and the pads 336a, 336c and vias 335a, 335c are depicted as generally circular, in other embodiments the traces, pads, and/or vias may have a different shape.

In one aspect, the traces 334a-c can comprise fine line and spaced (FLS) traces, which are characterized by certain dimensional attributes. FIG. 3 illustrates a variety of measurements or dimensions referred to herein. For example, the distance between the center of the pads 336a and 336c is a value depicted in FIG. 3 as "X." Similarly, the traces 334a-c have a width depicted in FIG. 3 as "Y." The distance between two elements, such as between the pads 336a, 336c and the trace 334b, is a value depicted in FIG. 3 as "Z." The dimension Z is generally referred to herein as the space between traces, which may be indicative of the space between two elements, such as the space between two traces (e.g., between traces 334a and 334b) or the space between a trace and a via pad (e.g., between the via pad 336a and the trace 334b), as applicable for a given embodiment or configuration. A plurality of traces is referred to herein, such as in the context of a routing layer. Such a plurality of traces includes traces and via pads, which are connected to the traces and disposed in the same routing layer. Thus, reference to a spacing between traces in a plurality of traces includes reference to the space between two traces and/or the space between a trace and a via pad.

Generally, the values for X, Y, and Z may be given on the order of microns. The values for Y and Z may be on the order of approximately 10 µm or less, respectively. Such FLS traces with a width of approximately 10 µm or less and/or that are spaced approximately 10 µm or less apart from one another are referred to herein as 10/10 L/S. Smaller values for Y and/or Z may allow the value of X to decrease. Being able to achieve these smaller values for X, Y, and/or Z may provide significant benefits. For example, as performance demands on bridges increase, it may be useful to provide more I/O ports. A smaller FLS may allow for more traces and/or pads to be placed in a routing layer of a bridge, thereby allowing an increased number of I/O ports without increasing cost and/or z-height.

Figure 4A:
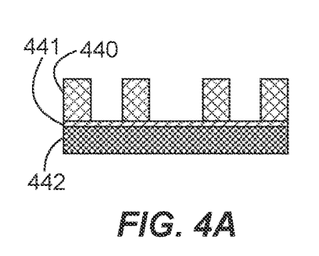
FIG. 4A illustrates patterning conductive elements of an interconnect bridge using a dry film resist (DFR) lamination in accordance with an example of a method for making an electrical interconnect bridge.

FIGS. 4A-8C illustrate aspects of an exemplary method or process for making an electrical interconnect bridge as disclosed herein. FIG. 4A represents a process for patterning conductive elements (e.g., traces) of an interconnect bridge using a dry film resist (DFR) lamination. In this process, a dry film laminate 440 is applied to a conductive (e.g., copper) layer 441, which is supported by a carrier panel 442. The conductive layer 441 may be included with the carrier panel 442 in the form of a foil or a seed layer of conductive material may be provided as needed, such as if the foil is not sufficient. The film is exposed and developed to provide a pattern for the conductive elements. The pattern can be configured to provide any suitable conductive element configuration or dimension. For example, the pattern can be configured to provide conductive elements with dimensions and spacing characteristic of FLS traces. Using the pattern, conductive elements 434a-c can be built up on the conductive layer 441, such as by electrolytic plating of copper on the layer, as represented in FIG. 4B. Once the conductive elements 434a-c have been formed, the DFR laminate can be removed or stripped away, as represented in FIG. 4C.

The carrier panel 442 may be referred to as a "peelable core". This carrier panel 442 may have different configurations in various embodiments. In some embodiments, the carrier panel may include two copper layers that are separated by a weak layer that may allow for separation of a manufactured non-singulated molded bridge substrate from the carrier. In this case, at the end of the process described below, a copper etch process may be used to remove the sacrificial copper layer, i.e. the copper layer that remains attached to the manufactured non-singulated molded bridge substrate subsequent to separation of the substrate from the carrier. However, other embodiments may include two dielectric layers, or a dielectric layer and a copper layer to allow for peeling. In embodiments where the sacrificial material after peel is a dielectric material, a removal process such as wet-blast or some other removal process may be used to remove this dielectric material instead of the above-described copper etch process. Other types of carriers such as a releasable tape and metal carrier can also be used. In such a case, a seed metal layer such as copper may be deposited before proceeding to the subsequent process steps. Accordingly, a thermal release and subsequent tape residue clean up step may be performed before copper etch as described in the peelable core case.

Figure 4B:
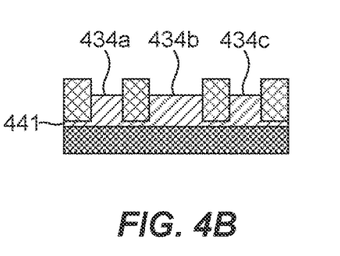
FIG. 4B illustrates building up conductive elements of an interconnect bridge in accordance with an example of a method for making an electrical interconnect bridge.
Figure 4C:
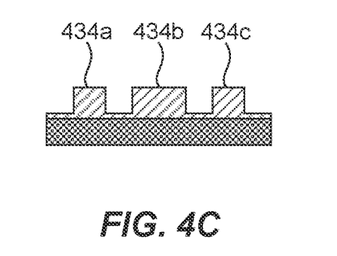
FIG. 4C illustrates removing DFR lamination in accordance with an example of a method for making an electrical interconnect bridge.
Figure 4D:
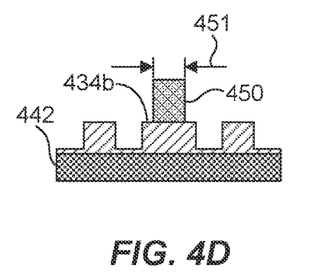
FIG. 4D illustrates forming a spacer on a conductive element in accordance with an example of a method for making an electrical interconnect bridge.

FIGS. 4D-4G illustrate aspects of a method for making a via for electrically coupling conductive elements of a bridge as disclosed herein. FIG. 4D illustrates forming a spacer 450 on a suitable conductive element, such as the conductive element 434b, which may be configured as a via pad. As further explained below, the spacer 450 is a temporary structure that provides a space or opening for the formation of a via between conductive elements of different routing layers. A via formed in such a spacer opening will have dimensional characteristics and geometry similar to that of the spacer 450. Thus, the spacer 450 can have a shape that is circular or non-circular (e.g., rectangular) in cross-section depending on the desired configuration of the via to be formed. The spacer 450 can also have dimensional attributes that reflect the desired dimensional attributes of a via to be formed.

When manufacturing pads and vias, the pad to via alignment tolerances may require that pads are sized to be larger than the alignment tolerances of the process to ensure that the entire via lands on the pad. As a result, the size of the pads may be limiting with regard to the number of traces that can be routed on any given layer. Consequently, improving the alignment capability of the pad and via manufacturing process can increase the number of traces in a routing layer. Typically, the spacer 450 will be formed by a technique or process that enables the spacer to have dimensional characteristics and positioning consistent with FLS traces so that a via formed in the spacer opening will have acceptable alignment with a trace pad. The spacer 450 can be formed by any suitable technique or process. In one aspect, the spacer 450 can be formed by curtain coating, spin coating, printing, dispensing, etc. to dispose material on the conductive element 434b. For example, in some embodiments, a high precision inkjet printer may be used to place the spacer 450 precisely at the desired location using unit level alignment, thereby resulting in a tighter via to pad tolerance. This tighter tolerance may enable a smaller value of X as described herein. As a result, the underlying pad size may then be significantly reduced to enable FLS interconnects. In other embodiments, the spacer 450 can be curtain coated, photo exposed, and developed, which may result in a tight via to pad tolerance enabling FLS interconnects. In some cases, a shape of the spacer 450 can be defined once material has been disposed on the conductive element 434b. In such cases, the shape of the spacer 450 can be defined by photo exposing/defining the shape or pattern, dry etching the shape or pattern, and/or any other suitable technique or process for defining a shape or pattern in preexisting or pre-applied spacer material.

Because the spacer 450 is temporary and is subsequently removed, as described below, to facilitate formation of a via, the spacer can be made or constructed of any suitable material that may facilitate removal of the spacer. For example, the spacer 450 can be made of a sacrificial material that can maintain sufficient dimensional stability to facilitate formation of a via as described herein, and also facilitate removal of the spacer when desired. In one aspect, the sacrificial material can be thermally decomposable, although any suitable type of sacrificial material can be utilized, such as liquid soluble materials. Examples of suitable sacrificial materials include polynorbornene and/or polycarbonate based polymers that decompose when exposed to a relatively high temperature. Such temperature may be at or above 180 degrees Celsius in some embodiments. In other embodiments, the temperature may be at or above 200 degrees Celsius. In some embodiments, an additional cleaning step may be necessary to remove remnants of the sacrificial element 450 from the via 452.

In one aspect, FIG. 4D also illustrates an electrical interconnect bridge precursor, which includes a trace (e.g., conductive element 434b) having a via pad, and a spacer 450 formed of a sacrificial material disposed on the via pad. The electrical interconnect bridge precursor illustrated also includes a carrier panel 442 supporting the trace.

Figure 4E:
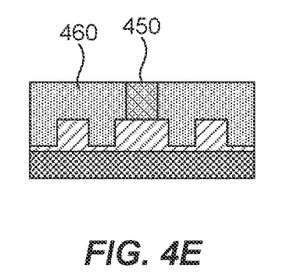
FIG. 4E illustrates disposing a material at least partially about lateral sides of a spacer in accordance with an example of a method for making an electrical interconnect bridge.

In FIG. 4E, a material 460 is disposed at least partially about lateral sides of the spacer 450. The material 460 can form a portion of a bridge substrate routing layer and, as such, can comprise any suitable material for a bridge substrate. The material 460 can be disposed about the spacer 450 by any suitable dispensing technique or process, and can be of any suitable form (e.g., a viscous form, solid particles, a sheet, etc.). Subsequently, the material 460 will be molded by any suitable mold technique (e.g., a compression molding process and/or a transfer molding process) about the spacer 450, and therefore the material 460 can comprise any suitable mold material, such an epoxy mold compound.

Figure 5:
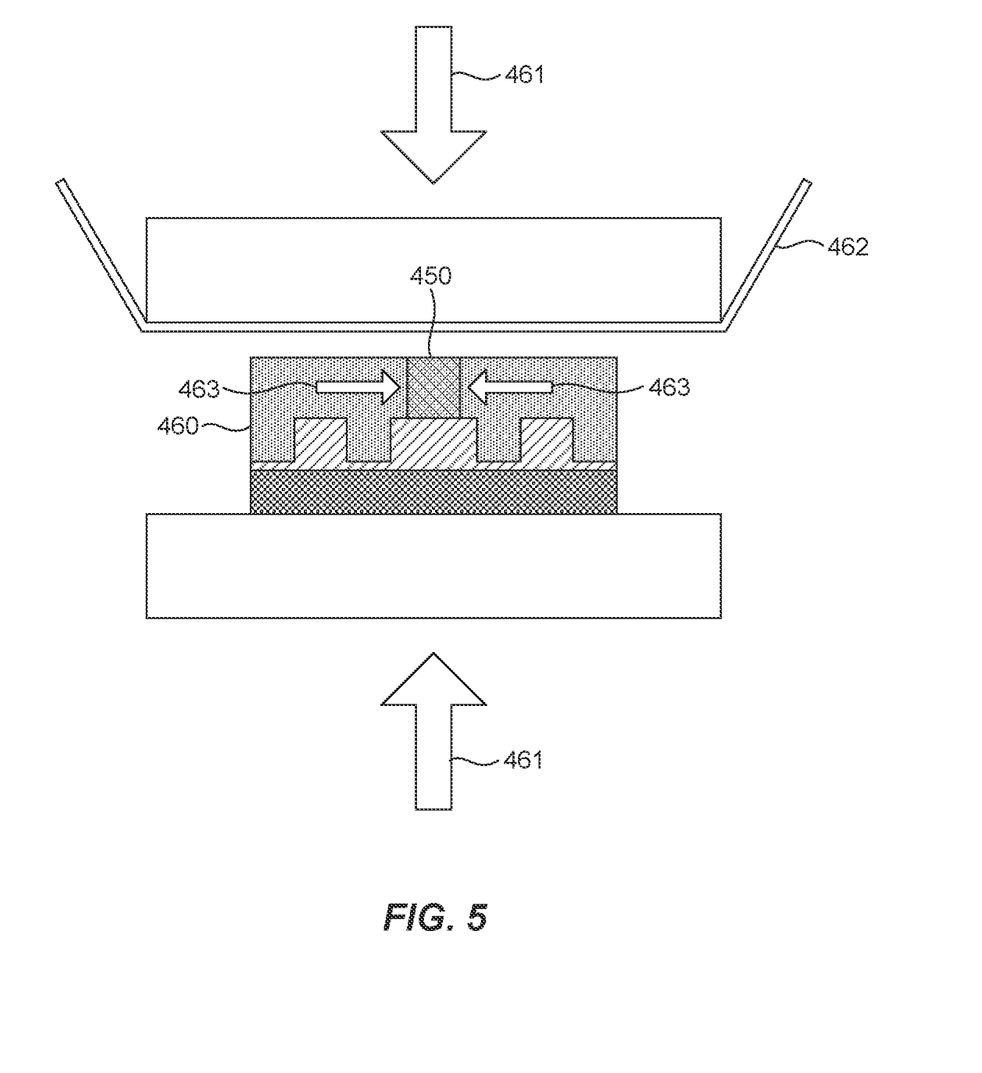
FIG. 5 illustrates compression molding material about a spacer in accordance with an example of a method for making an electrical interconnect bridge.

Compression molding the material 460 about the spacer 450 can be advantageous, as illustrated in FIG. 5. In this case, the spacer 450, which may be made of a relatively elastic or flexible material (e.g., a polymer), can be axially compressed 461 to a certain extent and molded flush with the material 460. A mold release material 462 can be used to facilitate release of the mold material 460 and/or the spacer 450 from a mold component. In addition to axial compressive forces 461, lateral forces 463 acting on the spacer 450 from the mold material 460 can maintain the spacer 450 in place (e.g., little to no movement) during the compression molding process. Thus, an exposed top portion of the spacer 450 can be flush with the top of the mold material 460 as a result of the compression mold process, which obviates the need for any additional processing (e.g., grinding) to achieve such a relationship, thereby reducing cost and improving yield. In addition, since grinding of the mold compound may not be required, the surface of the mold compound may not be inherently damaged, thereby enabling significantly higher reliability and ability to pattern finer lines and spaces.

In one aspect, FIG. 4E also illustrates an electrical interconnect bridge precursor, which in this case further includes material 460 (e.g., mold compound) disposed at least partially about lateral sides of the spacer 450. The spacer 450 can be made of a sacrificial material, which can facilitate removal of the spacer such that an opening remains in the material 460 in communication with a via pad, as discussed below.

Figure 4F:
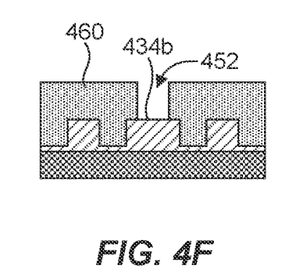
FIG. 4F illustrates removing a spacer to form an opening in the material in communication with the conductive element in accordance with an example of a method for making an electrical interconnect bridge.

For example, FIG. 4F illustrates the spacer removed to form an opening 452 in the material 460 in communication with the conductive element 434b. The spacer can be removed by any suitable technique or process. As mentioned above, the spacer can be made of a sacrificial material, which can facilitate removal of the spacer by exposure to heat and/or liquid. In one aspect, therefore, the spacer can be removed by heating the spacer to a temperature sufficient to decompose the sacrificial material (e.g., to a gas) while not negatively impacting the surrounding materials or structures (e.g., melting the material 460). Because the spacer is maintained in place when the material 460 is disposed about the spacer (e.g., during compression molding), a tight profile for a via is established by the opening 452 that is formed in the material 460 by the removal of the spacer, which can facilitate the formation of a via having minimal misalignment with the underlying pad.

Figure 4G:
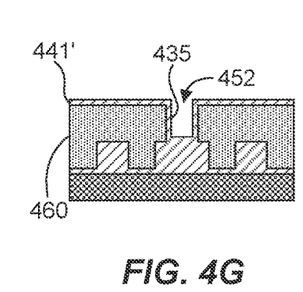
FIG. 4G illustrates disposing conductive material in the opening to form a via in accordance with an example of a method for making an electrical interconnect bridge.

With an opening formed in the material 460 by the removal of the spacer, a conductive material (e.g., copper) can be disposed in the opening 452 to form a via 435, as illustrated in FIG. 4G. A conductive material can be disposed in the opening 452 by any suitable technique or process, such as forming a seed layer of the conductive material and/or plating the conductive material. Conductive material can also be disposed on the material 460 to form a thin conductive layer 441' (e.g., a seed layer for the formation of additional conductive elements).

Figure 4H:
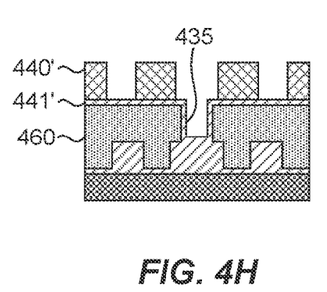
FIG. 4H illustrates patterning conductive elements on a routing layer of an interconnect bridge using DFR lamination in accordance with an example of a method for making an electrical interconnect bridge.
Figure 4I:
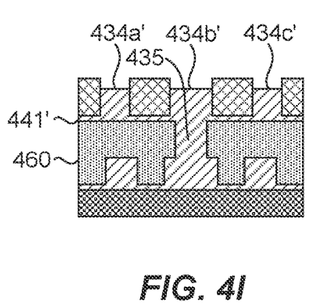
FIG. 4I illustrates building up conductive elements on a routing layer of an interconnect bridge in accordance with an example of a method for making an electrical interconnect bridge.
Figure 4J:
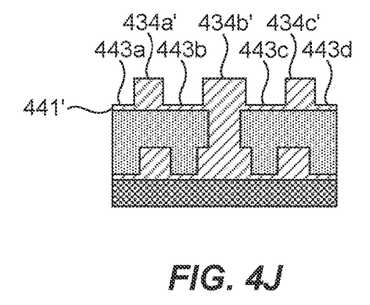
FIG. 4J illustrates removing DFR lamination from a routing layer in accordance with an example of a method for making an electrical interconnect bridge.
Figure 4K:
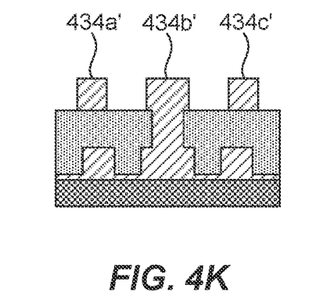
FIG. 4K illustrates removing excess conductive material from a routing layer in accordance with an example of a method for making an electrical interconnect bridge.

Conductive elements (e.g., traces) for the next routing layer can be formed in any suitable manner, such as was previously described with reference to FIGS. 4A-4C. For example, FIG. 4H represents a process for patterning conductive elements (e.g., traces) of an interconnect bridge using DFR lamination, where a dry film laminate 440' is applied to the conductive layer 441' formed on the material 460. The film is exposed and developed to provide a pattern for conductive elements of the next routing layer. The pattern can be configured to provide any suitable conductive element configuration or dimension. For example, the pattern can be configured to provide conductive elements with dimensions and spacing characteristic of FLS traces. Using the pattern, conductive elements 434a'-c' can be built up on the conductive layer 441' and the via 435, such as by electrolytic plating of copper on the conductive layer, as represented in FIG. 4I. This process can also fill the opening in the material 460 with conductive material, thus further forming the via 435. Once the conductive elements 434a'-c' have been formed, the DFR laminate can be stripped away, as represented in FIG. 4J. Exposed portions 443a-d of conductive material extending from and between the conductive elements 434a'-c' can be removed or stripped as shown in FIG. 4K to ensure no unwanted electrical coupling of the conductive elements.

At this point, the process described in FIGS. 4D-4G can be repeated to form another via extending to another routing layer, and the process described in FIGS. 4H-4K can be repeated to form conductive elements of the next routing layer. These processes can be repeated to form any desired number of vias and routing layers. Because multiple DFR stripping techniques may not be necessary for each layer, the overall cost and manufacturing complexity of the package may be reduced.

Figure 6:
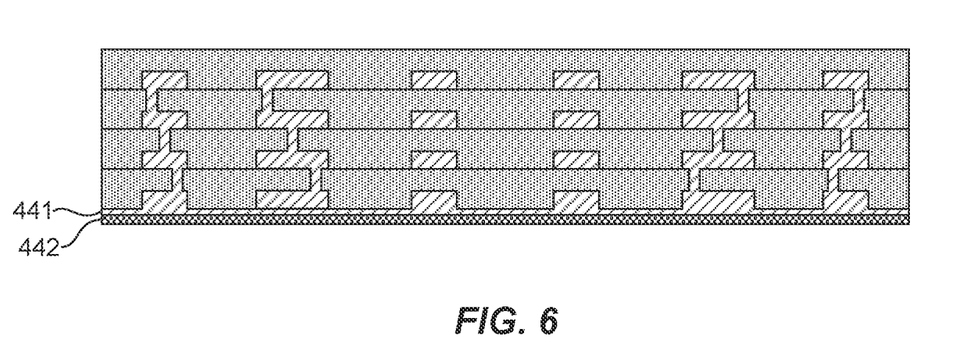
FIG. 6 illustrates an electrical interconnect bridge with multiple routing layers of conductive elements coupled by vias disposed on a carrier in accordance with an example of a method for making an electrical interconnect bridge.

When no more routing layers are desired, material (e.g., mold compound) can be formed around exposed conductive elements (e.g., conductive elements 434a'-c' illustrated in FIG. 4K) to cover the conductive elements and form the final bridge substrate routing layer. The result of this process can be a bridge with multiple routing layers of FLS traces coupled by vias, as illustrated in FIG. 6. Desired CTE for mold compound materials can be achieved by modifying mold formulations, such as by lowering filler content and/or modifying the fillers. For example, the table below shows some mold compound formulations that can be used for the bridge substrate.

| Varying CTE with Filler Content | | | |
| --- | --- | --- | --- |
| Type | Mold Compound | Filler | CTE (ppm/° C.) |
| Granular | Epoxy Phenol | Silica | 7-24 |
| Liquid | Epoxy Anhydride | Silica | 7-24 |
| Liquid | Epoxy Amine | Silica | 7-24 |
| Granular | Epoxy Phenol | Silica | 7-50 |
| Granular | Epoxy Phenol | Alumina | 7-50 |
| Granular | Epoxy Phenol | Organic | 7-50 |

Figure 7:
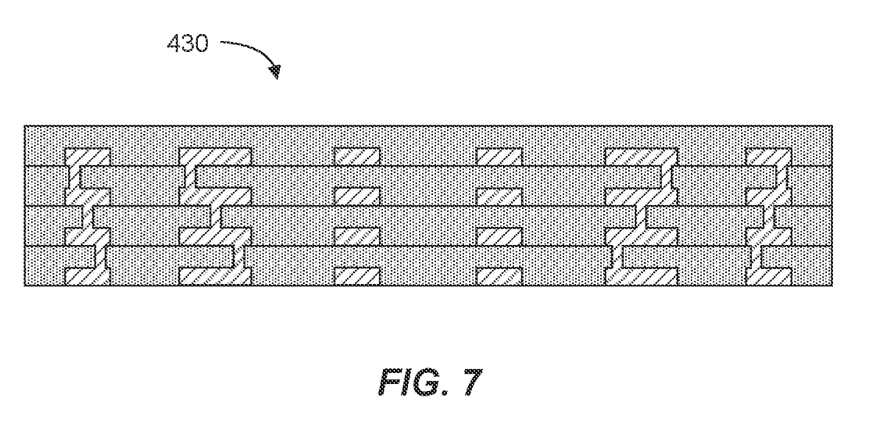
FIG. 7 illustrates removal of the carrier to form an electrical interconnect bridge in accordance with an example of a method for making an electrical interconnect bridge.

As illustrated in FIG. 7, the conductive layer 441 and the substrate or carrier 442 can be removed by any suitable technique or process, such as by peeling and/or etching, which can result in a finished bridge 430. In one embodiment mentioned above, the carrier 442 may comprise a peelable core, which can be peeled at the peelable interface of the peelable core to remove the carrier 442, followed by a copper etch to remove the conductive layer 441. Desired surface finish on the pads may then be performed, followed by applying solder bumps (not shown) to finish the bridge. If desired, multiple bridges can be manufactured simultaneously by the processes disclosed herein. If needed, multiple bridges formed together can be singulated to form individual bridges. Any suitable technique, including mechanical and chemical techniques, can be utilized to singulate (e.g., divide or separate) bridges from one another, such as cutting (e.g., laser), sawing, shearing, milling, broaching, etching, etc.

Figure 8A:
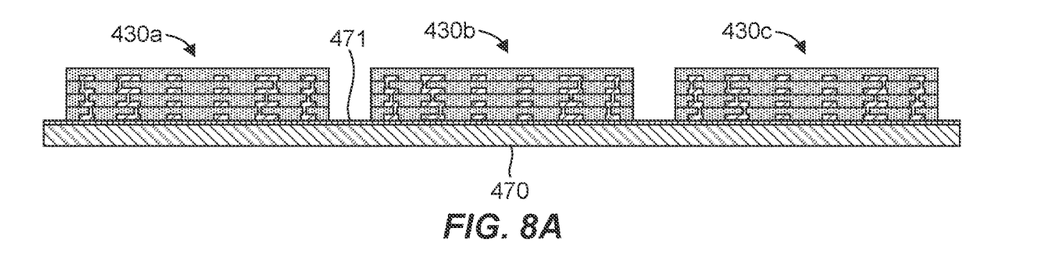
FIG. 8A illustrates a plurality of electrical interconnect bridges disposed on a carrier in accordance with an example of a method for making an electrical interconnect bridge.
Figure 8B:
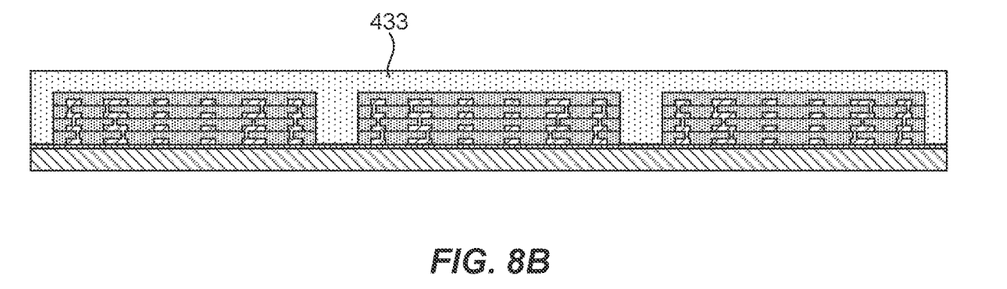
FIG. 8B illustrates disposed encapsulant material over a plurality of electrical interconnect bridges in accordance with an example of a method for making an electrical interconnect bridge.
Figure 8C:
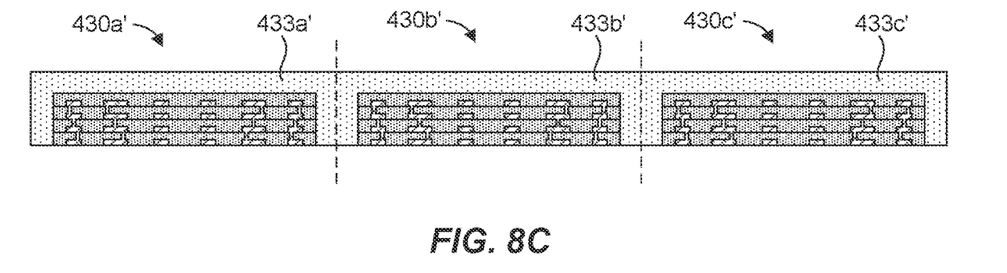
FIG. 8C illustrates singulating and removing a plurality of electrical interconnect bridges having encapsulant material from a carrier in accordance with an example of a method for making an electrical interconnect bridge.

In some cases, it may be desirable to have an encapsulant material disposed about at least a portion of the bridge 430, such as about portions of the routing layers. FIGS. 8A-8C illustrate a process for accomplishing this. For example, FIG. 8A illustrates a plurality of bridges 430a-c, which are similar to the bridge 430 of FIG. 7, disposed (e.g., "pick and placed") on a carrier 470. The carrier 470 can be of any suitable configuration and made of any suitable type of material (e.g., stainless steel). A release material 471 (e.g., a thermal release tape) can be disposed on the carrier 470 to facilitate release and separation of finished bridges from the carrier. As illustrated in FIG. 8B, encapsulant material 433 can be disposed over the bridges 430a-c, such as by overmolding. Finished bridges 430a'-c', each with an encapsulant material 433a'-c', respectively, can be singulated and removed from the carrier, as illustrated in FIG. 8C. The present disclosure therefore provides a bridge that can be manufactured using low-cost substrate packaging (e.g., molding) instead of typical expensive wafer fabrication processes.

Finished bridges can be disposed (e.g., "pick and placed") in desired package substrate locations for providing electrical interconnects between electronic components. Once disposed in, or combined with, a package substrate, typical processing can be utilized to prepare the package substrate for coupling with electronic components.

Figure 9:
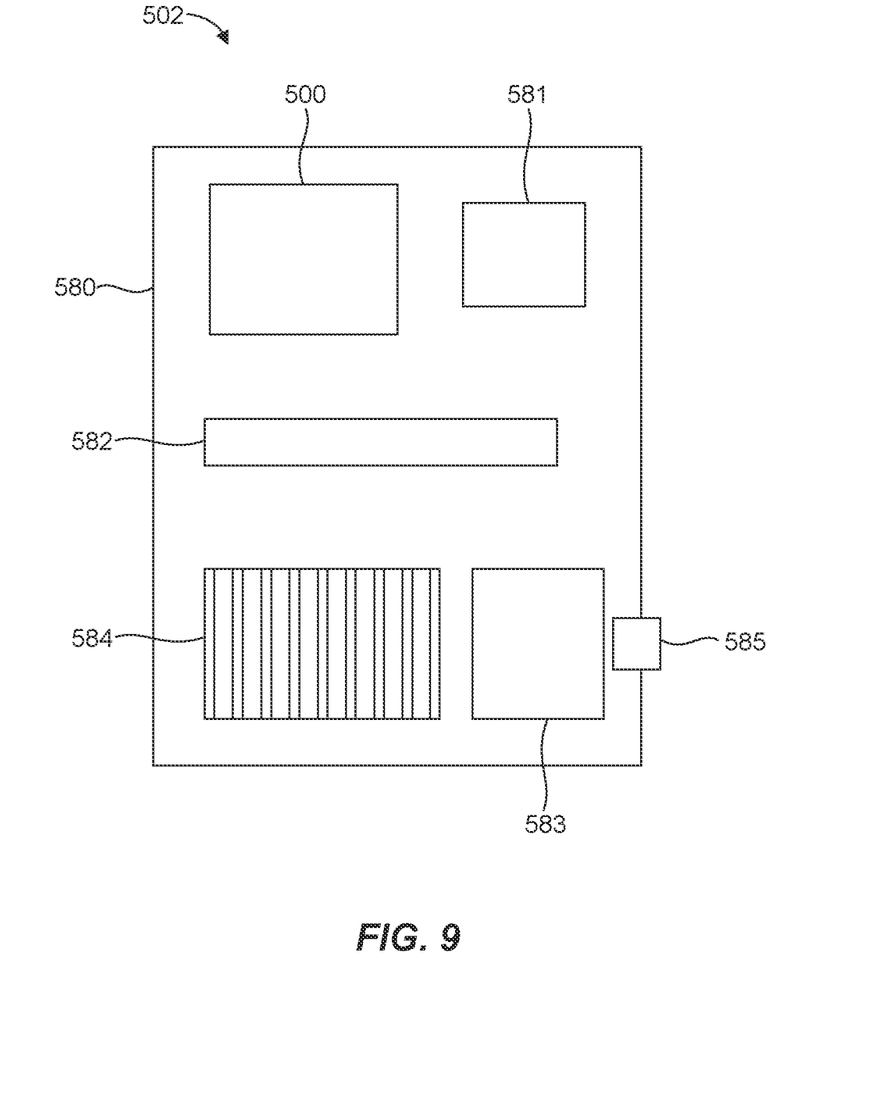
FIG. 9 is a schematic illustration of an exemplary computing system.

FIG. 9 illustrates an example computing system 502. The computing system 502 can include an electronic device package 500 as disclosed herein, coupled to a motherboard 580. In one aspect, the computing system 502 can also include a processor 581, a memory device 582, a radio 583, a heat sink 584, a port 585, a slot, or any other suitable device or component, which can be operably coupled to the motherboard 580. The computing system 502 can comprise any type of computing system, such as a desktop computer, a laptop computer, a tablet computer, a smartphone, a server, etc. Other embodiments need not include all of the features specified in FIG. 9, and may include alternative features not specified in FIG. 9.

EXAMPLES

The following examples pertain to further embodiments.

In one example there is provided an electrical interconnect bridge comprising a bridge substrate formed of a mold compound material, a plurality of routing layers within the bridge substrate, each routing layer having a plurality of FLS traces, and a via extending through the substrate and electrically coupling at least one of the FLS traces in one of the routing layers to at least one of the FLS traces in another of the routing layers.

In one example of an electrical interconnect bridge, the bridge substrate mold compound material of a first routing layer of the plurality of routing layers includes a first mold compound material and the bridge substrate mold compound material of a second routing layer of the plurality of routing layers includes a second mold compound material.

In one example of an electrical interconnect bridge, the bridge substrate of the plurality of routing layers includes the same mold compound material.

In one example of an electrical interconnect bridge, the mold compound material comprises epoxy phenol, epoxy anhydride, epoxy amine, or a combination thereof.

In one example of an electrical interconnect bridge, the first and second plurality of FLS traces have a maximum width of about 10 µm.

In one example of an electrical interconnect bridge, the first plurality of FLS traces are spaced from one another by at most about 10 µm.

In one example of an electrical interconnect bridge, the second plurality of FLS traces are spaced from one another by at most about 10 µm.

In one example of an electrical interconnect bridge, the via has a non-circular cross-section.

In one example of an electrical interconnect bridge, the bridge substrate further comprises an encapsulant material disposed at least partially about each of the plurality of routing layers.

In one example of an electrical interconnect bridge, a CTE of the mold compound material is from about 7 to about 25 ppm per degree Celsius.

In one example there is provided an electrical interconnect bridge precursor comprising a trace having a via pad, and a spacer formed of a sacrificial material disposed on the via pad.

In one example of an electrical interconnect bridge precursor, the trace has a maximum width of about 10 µm.

In one example of an electrical interconnect bridge precursor, the trace comprises a plurality of traces that are spaced from one another by at most about 10 µm.

In one example of an electrical interconnect bridge precursor, the sacrificial material is thermally decomposable.

In one example of an electrical interconnect bridge precursor, the sacrificial material comprises polynorbornene, polycarbonate, or a combination thereof.

In one example of an electrical interconnect bridge precursor, the spacer has a non-circular cross-section.

In one example of an electrical interconnect bridge precursor, the electrical interconnect bridge precursor comprises mold compound material disposed at least partially about lateral sides of the spacer, the sacrificial material facilitating removal of the spacer such that an opening remains in the mold compound material in communication with the via pad.

In one example of an electrical interconnect bridge precursor, the electrical interconnect bridge precursor comprises a carrier supporting the trace.

In one example there is provided an electronic device package substrate assembly comprising a package substrate, and an electrical interconnect bridge embedded in the package substrate configured to route electrical signals between a first electronic component and a second electronic component coupled to the package substrate, the electrical interconnect bridge having a bridge substrate formed of a mold compound material, a first routing layer within the bridge substrate having a first plurality of FLS traces, a second routing layer disposed proximate the first routing layer within the bridge substrate having a second plurality of FLS traces, and a via extending through the bridge substrate and electrically coupling at least one of the first plurality of FLS traces to at least one of the second plurality of FLS traces.

In one example of an electronic device package substrate assembly, the bridge substrate mold compound material of the first routing layer includes a first mold compound material and the bridge substrate mold compound material of the second routing layer includes a second mold compound material.

In one example of an electronic device package substrate assembly, the bridge substrate of the first and second routing layers includes the same mold compound material.

In one example of an electronic device package substrate assembly, the mold compound material comprises epoxy phenol, epoxy anhydride, epoxy amine, or a combination thereof.

In one example of an electronic device package substrate assembly, the first and second plurality of FLS traces have a maximum width of about 10 µm.

In one example of an electronic device package substrate assembly, the first plurality of FLS traces are spaced from one another by at most about 10 µm.

In one example of an electronic device package substrate assembly, the second plurality of FLS traces are spaced from one another by at most about 10 µm.

In one example of an electronic device package substrate assembly, the via has a non-circular cross-section.

In one example of an electronic device package substrate assembly, the bridge substrate further comprises an encapsulant material disposed at least partially about the first and second routing layers, such that the encapsulant material is proximate a portion of the package substrate.

In one example of an electronic device package substrate assembly, a CTE of the mold compound material is from about 7 to about 25 ppm per degree Celsius.

In one example there is provided an electronic device package comprising a first electronic component, a second electronic component, a package substrate, and an electrical interconnect bridge embedded in the package substrate to route electrical signals between the first electronic component and the second electronic component, the electrical interconnect bridge having a bridge substrate formed of a mold compound material, a first routing layer within the bridge substrate having a first plurality of FLS traces, a second routing layer disposed proximate the first routing layer within the bridge substrate having a second plurality of FLS traces, and a via extending through the bridge substrate and electrically coupling at least one of the first plurality of FLS traces to at least one of the second plurality of FLS traces.

In one example of an electronic device package, the bridge substrate mold compound material of the first routing layer includes a first mold compound material and the bridge substrate mold compound material of the second routing layer includes a second mold compound material.

In one example of an electronic device package, the bridge substrate of the first and second routing layers includes the same mold compound material.

In one example of an electronic device package, the mold compound material comprises epoxy phenol, epoxy anhydride, epoxy amine, or a combination thereof.

In one example of an electronic device package, the first and second plurality of FLS traces have a maximum width of about 10 μm.

In one example of an electronic device package, the first plurality of FLS traces are spaced from one another by at most about 10 μm.

In one example of an electronic device package, the second plurality of FLS traces are spaced from one another by at most about 10 μm.

In one example of an electronic device package, the via has a non-circular cross-section.

In one example of an electronic device package, the bridge substrate further comprises an encapsulant material disposed at least partially about the first and second routing layers, such that the encapsulant material is proximate a portion of the package substrate.

In one example of an electronic device package, a CTE of the mold compound material is from about 7 to about 25 ppm per degree Celsius.

In one example there is provided a computing system comprising a motherboard, and an electronic device package operably coupled to the motherboard, the electronic device package including a first electronic component, a second electronic component, a package substrate, and an electrical interconnect bridge embedded in the package substrate to route electrical signals between the first electronic component and the second electronic component, the electrical interconnect bridge having a bridge substrate formed of a mold compound material, a first routing layer within the bridge substrate having a first plurality of FLS traces, a second routing layer disposed proximate the first routing layer within the bridge substrate having a second plurality of FLS traces, and a via extending through the bridge substrate and electrically coupling at least one of the first plurality of FLS traces to at least one of the second plurality of FLS traces.

In one example of a computing system, the computing system comprises a desktop computer, a laptop, a tablet, a smartphone, a server, or a combination thereof.

In one example of a computing system, the computing system further comprises a processor, a memory device, a heat sink, a radio, a slot, a port, or a combination thereof operably coupled to the motherboard.

In one example there is provided a method for making a via for electrically coupling conductive elements comprising forming a spacer on a conductive element, molding a mold material at least partially about lateral sides of the spacer, removing the spacer to form an opening in the mold material in communication with the conductive element, and disposing a conductive material in the opening to form a via.

In one example of a method for making a via for electrically coupling conductive elements, forming a spacer comprises disposing a sacrificial material on the conductive element.

In one example of a method for making a via for electrically coupling conductive elements, the conductive element comprises a via pad.

In one example of a method for making a via for electrically coupling conductive elements, disposing a sacrificial material on the conductive element comprises curtain coating, spin coating, printing, dispensing, or a combination thereof.

In one example of a method for making a via for electrically coupling conductive elements, the method comprises defining a shape of the spacer.

In one example of a method for making a via for electrically coupling conductive elements, defining a shape of the spacer comprises photo-defining the shape, dry etching the shape, or a combination thereof.

In one example of a method for making a via for electrically coupling conductive elements, the shape of the spacer has a non-circular cross-section.

In one example of a method for making a via for electrically coupling conductive elements, molding a mold material about the spacer comprises compression molding such that the spacer is flush with the mold material.

In one example of a method for making a via for electrically coupling conductive elements, the spacer is formed of a sacrificial material, and wherein removing the spacer comprises heating the spacer sufficient to decompose the sacrificial material.

In one example of a method for making a via for electrically coupling conductive elements, the sacrificial material comprises polynorbornene, polycarbonate, or a combination thereof.

In one example of a method for making a via for electrically coupling conductive elements, disposing a conductive material in the opening comprises forming a seed layer of the conductive material, plating the conductive material, or a combination thereof.

In one example of a method for making a via for electrically coupling conductive elements, the conductive element comprises at least one of a trace and a via pad.

In one example of a method for making a via for electrically coupling conductive elements, the trace has a maximum width of about 10 μm.

In one example of a method for making a via for electrically coupling conductive elements, the trace comprises a plurality of traces that are spaced from one another by at most about 10 μm.

In one example of a method for making a via for electrically coupling conductive elements, the method comprises disposing conductive material on the via to form a second conductive element.

In one example of a method for making a via for electrically coupling conductive elements, the method comprises forming a second spacer on the second conductive element, molding a mold material at least partially about lateral sides of the second spacer, removing the second spacer to form a second opening in the mold material in communication with the second conductive element, and disposing a conductive material in the second opening to form a second via.

In one example of a method for making a via for electrically coupling conductive elements, the second conductive element comprises a trace.

In one example of a method for making a via for electrically coupling conductive elements, the trace has a maximum width of about 10 μm.

In one example of a method for making a via for electrically coupling conductive elements, the trace comprises a plurality of traces that are spaced from one another by at most about 10 μm.

In one example there is provided a method for making an electrical interconnect bridge comprising forming a first conductive element, forming a via as described herein on the first conductive element, and forming a second conductive element on the via.

In one example there is provided an electrical interconnect bridge made by the above method.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A method for fabricating an electrical interconnect bridge, the method comprising:
   forming a spacer on a conductive element;
   molding a mold material at least partially about lateral sides of the spacer;
   removing the spacer to form an opening in the mold material in communication with the conductive element;
   disposing a conductive material in the opening to form a first via, the first via for coupling to a first electronic component;
   forming a second via, the second via for coupling to a second electronic component; and coupling the second via to the first via.

2. The method of claim 1, wherein forming a spacer comprises disposing a sacrificial material on the conductive element.

3. The method of claim 1, further comprising defining a shape of the spacer.

4. The method of claim 1, wherein molding a mold material about the spacer comprises compression molding such that the spacer is flush with the mold material.

5. The method of claim 1, wherein the spacer is formed of a sacrificial material, and wherein removing the spacer comprises heating the spacer sufficient to decompose the sacrificial material.

6. The method of claim 1, wherein disposing a conductive material in the opening comprises forming a seed layer of the conductive material, plating the conductive material, or a combination thereof.

7. The method of claim 1, wherein the conductive element comprises at least one of a trace and a via pad.

8. The method of claim 1, further comprising disposing conductive material on the first via to form a second conductive element.

\* \* \* \* \*